US012560630B2

(12) United States Patent
    Tan

(10) Patent No.:  US 12,560,630 B2
(45) Date of Patent:      Feb. 24, 2026

(54) ENTROPY ON ONE-DIMENSIONAL AND TWO-DIMENSIONAL HISTOGRAMS

(71) Applicant: Tektronix, Inc., Beaverton, OR (US)

(72) Inventor: Kan Tan, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 78 days.

(21) Appl. No.: 17/981,022

(22) Filed: Nov. 4, 2022

(65) Prior Publication Data

US 2023/0184810 A1      Jun. 15, 2023

Related U.S. Application Data

(60) Provisional application No. 63/288,493, filed on Dec. 10, 2021.

(51) Int. Cl.
    *G01R 13/02*          (2006.01)
(52) U.S. Cl.
    CPC ..................................... *G01R 13/02* (2013.01)
(58) Field of Classification Search
    CPC .............................. G01R 13/02; G01R 13/029
    See application file for complete search history.

(56) References Cited

U.S. PATENT DOCUMENTS

| | | | | |
|---|---|---|---|---|
| 5,644,417 A | * | 7/1997 | Aulet ..................... | H04B 10/07 |
| | | | | 398/32 |
| 2004/0152418 A1 | * | 8/2004 | Sinha .................. | H04L 27/0002 |
| | | | | 455/42 |
| 2018/0074096 A1 | * | 3/2018 | Absher .................. | G01R 23/16 |
| 2022/0109498 A1 | * | 4/2022 | Vaez-Ghaemi ...... | H04B 10/071 |

OTHER PUBLICATIONS

Xiao Liu et al.: Symbol Timing and Carrier Frequency Recovery Based on Entropy Minimization, DOI 10.1109/ACCESS.2018. 2871358, IEEE Access (Year: 2018).*
Xiao Liu, Entropy Minimization Based Synchronization Algorithm for Underwater Acoustic Receivers, WUWNET'17, Nov. 6-8, 2017, Halifax, NS, Canada c 2017 ACM. ISBN 978-1-4503-5561—Feb. 17, 2011 (Year: 2017).*
Xiao, Liu and J.-F. Bousquet, "Symbol Timing and Carrier Frequency Recovery Based on Entropy Minimization," in IEEE Access, vol. 6, pp. 53319-53329, 2018 (Year: 2018).*
Liu, Entropy Minimization Based Synchronization Algorithm for Underwater Acoustic Receivers, WUWNET'17, Nov. 6-8, 2017 , Halifax, NS, Canada (Year: 2017).*

* cited by examiner

*Primary Examiner* — Michael J Dalbo
(74) *Attorney, Agent, or Firm* — Miller Nash LLP; Andrew J. Harrington

(57)          ABSTRACT

A test and measurement device has a port to receive a signal from a device under test (DUT), one or more analog-to-digital converters (ADC) to digitize the signal to create one or more waveforms, a display, and one or more processors configured to execute code that causes the one or more processors to: generate a histogram from the waveform, the histogram having one or more dimensions; and calculate one or more entropy values for each of the one or more dimensions. A method includes receiving a signal from a device under test (DUT) at a test and measurement device, digitizing the signal using one or more analog-to-digital converters (ADC) to produce a waveform, generating a histogram from the waveform, the histogram having one or more dimensions, and calculating one or more entropy values for each of the one or more dimensions.

12 Claims, 6 Drawing Sheets

ENTROPY ON ONE-DIMENSIONAL AND TWO-DIMENSIONAL HISTOGRAMS

CROSS-REFERENCE TO RELATED APPLICATIONS

This disclosure claims benefit of U.S. Provisional Application No. 63/288,493, titled "ENTROPY PLOTS OVER EYE DIAGRAM," filed on Dec. 10, 2021, the disclosure of which is incorporated herein by reference in its entirety.

TECHNICAL FIELD

This disclosure relates to test and measurement instruments, and more particularly to measurements made by a test and measurement instrument.

BACKGROUND

High-speed signaling standards continue to set out higher speed requirements for data center and other applications. For example, 26 Gb/s and 53 Gb/s NRZ, 26 GBaud and 53 GBaud PAM4, 32GBaud PAM4, are used in 100/200G/400 Gb Ethernet and PCIE Gen6. See "PCI Express Base Specification 6.0, Version 1.0," Specifications |PCI-SIG (pcisig.com) 2021; "IEEE P802.3bs D3.5, Draft standard for Ethernet amendment 10: media access control parameters, physical layers and management parameters for 200 Gbs/ and 400 Gb/s operation," 2017; "IEEE P802.3cd D3.5, Draft standard for Ethernet amendment 3: media access control parameters for 50 Gb/s and physical layers and management parameters for 50 Gb/s, 100 Gb/s and 200 Gbs operation," 2018.

For these applications, the real-time oscilloscopes and the equivalent-time oscilloscopes are commonly used by R&D for debug and characterization, and for volume productions. Oscilloscopes generally provide primary plots of 1-dimensional histograms and 2-dimensional histograms. For a waveform on a display, the user can select a 2D section of the waveform and the instrument may provide a 1D histogram, vertical or horizontal of the waveform. Users can select a section of a particular display of multiple waveforms called an eye diagram, and select either the vertical or the horizontal as a 1D histogram. Alternatively, the users can use the data from both dimensions of an eye diagram as a 2D histogram. Typical statistical values such as mean, standard deviation, min, max, are displayed with the plot, and these values are used in various signal analysis and measurements.

Manufacturers need to confirm that the devices under test (DUT) operate in accordance with the standards, such as those above. Generally, the standards use one or more figures of merit (FOM) to measure performance. This often involves complicated and time consuming calculations of the various measures, such as transmitter dispersion eye closure quaternary (TDECQ), for Pulse Amplitude Modulation-4 (PAM4) signals, signal-to-noise-and-distortion ratio (SNDR).

Similar issues arise when optimizing equalization filters such as continuous time linear equalizers (CTLE), feedforward equalizer (FFE) and decision feedback equalizers (DFE) because these processes have some inefficiencies that using a less complicated, faster measurement would solve.

DESCRIPTION

Entropy comprises both a scientific concept and a measurable physical property, most commonly associated with a state of disorder, randomness, or uncertainty. Entropy has been explored in many different fields, including classical thermodynamics, statistical physics, and information theory. Signals tested by oscilloscopes generally relate to communications systems, for which information theory is fundamental.

Test and measurement systems, particularly, oscilloscopes, have not used entropy. The embodiments here involve the concept of entropy and describe ways to use it to solve some common oscilloscope measurement and analysis tasks more efficiently.

Figure 1:
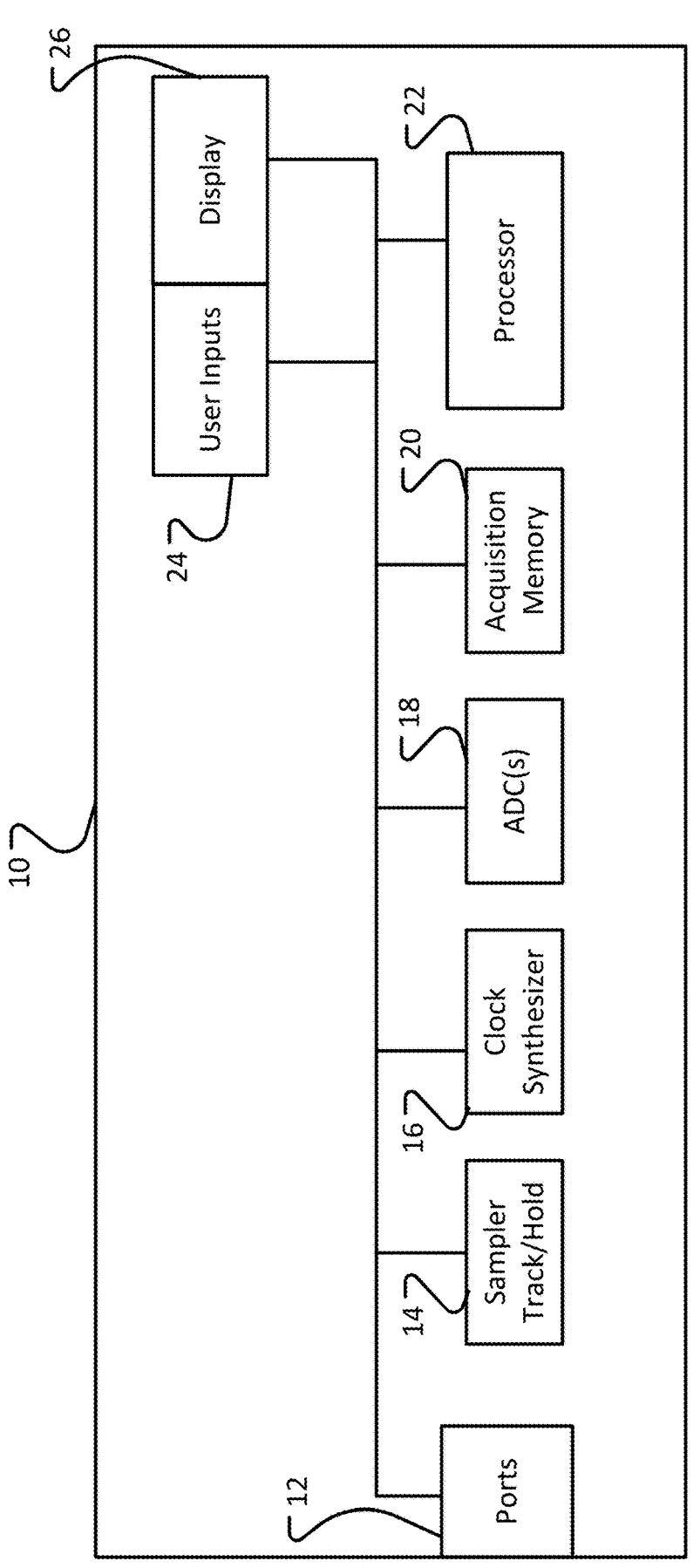
FIG. 1 shows an embodiment of a test and measurement device that produces an entropy value or an entropy vector.

FIG. 1 shows an embodiment of a test and measurement device 10. FIG. 1 illustrates an example block diagram of a test and measurement instrument 10. The test and measurement instrument 10 includes one or more ports 12, which may be any electrical signaling medium or optical signaling converted to electrical. Each port 12 may comprise a channel of the test and measurement instrument 10.

A port 12 receives a signal from a device under test (DUT) and sends it to a sampler track and hold circuit 14. The track and hold circuit 14 tracks and holds each signal steady for a period of time sufficient to enable analog to digital conversion by one or more high-resolution analog-to-digital converter(s) (ADC) 18. The ADC may receive a sample clock from the clock synthesizer 16 under control of one or more processors 22.

The ADC 18 converts the analog signal from the track and hold circuit 14 to a digital signal. The ADC 18 has a sampling rate, discussed in more detail below. For example, the ADC 18 can sample the signals from a few GS/s to hundreds of GS/s. In some configurations, the ADC 18 can sample the analog signal between 1 GS/s to 200 GS/s. In other configurations, the ADC 18 can sample the analog signal between 2 GS/s and 25 GS/s. The digitized signal from the ADC 18 can then be stored in an acquisition memory 20. The ADC 18 could be a single high-resolution ADC, such as a 12-bit ADC.

The one or more processors 22 may be configured to execute instructions from memory and may perform any methods and/or associated steps indicated by such instructions. In one embodiment, the one or more processors take the digitized waveform, generate a histogram, having one or two dimensions. The one or more processors then use the histogram to calculate one or more entropy values. The test and measurement instrument then may use the entropy values in memory 20 or any other memory on the test and measurement instrument 10 may be implemented as processor cache, random access memory (RAM), read only memory (ROM), solid state memory, hard disk drive(s), or any other memory type. Memory acts as a medium for storing data, computer program products, and other instructions.

User interface 24 is coupled to the one or more processors 22. User interface 24 may include a keyboard, mouse, trackball, touchscreen, and/or any other controls employable by a user to interact with a GUI on the display 26. The display 26 may be a digital screen, a cathode ray tube based display, or any other monitor to display waveforms, measurements, and other data to a user.

One of the basic features of test and measurement instruments such as oscilloscope includes horizontal or vertical histograms. These histograms contain the number of hits at each bin, typically one-dimensional. With the histogram, the instrument may also provide other statistical values, including the mean, standard deviation, minimum, maximum and peak-to-peak values. Histograms already contain probability information, so one can add the entropy value to the list of statistical information provided.

Figure 2:
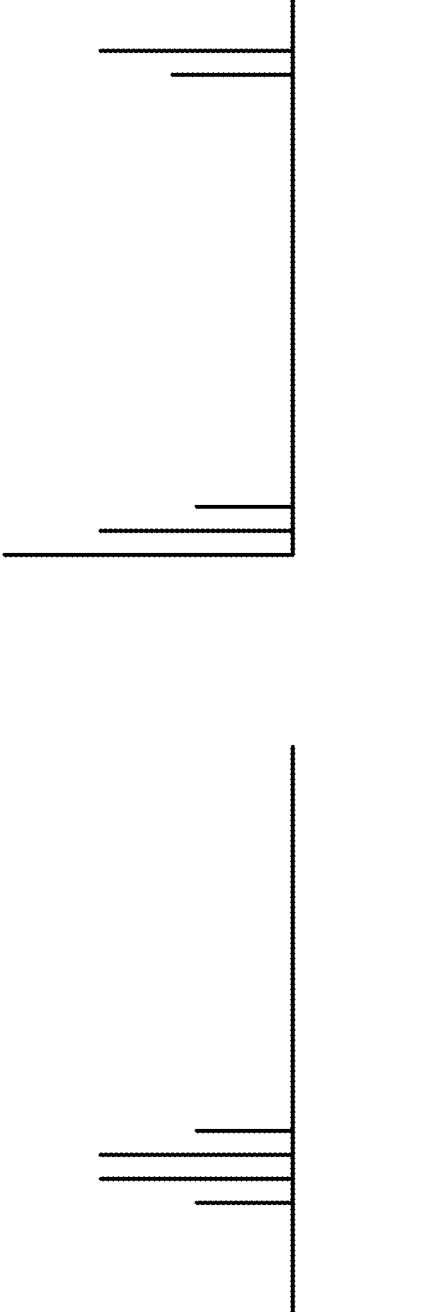
FIG. 2 shows an example of two one-dimensional histograms that can be used to make entropy measurements.

FIG. 2 shows examples of two 1D histograms, in which the horizontal axis represents bin locations, and the vertical axis represents number of hits at each bin. Each bar in the histogram represents the number of hits at certain bins, and there are 4 bin with non-zero hits in each of the histograms shown. For these two 1D histograms, their entropy values are equal. However, their standard deviation values are different. The entropy value reveals certain statistical properties that typical statistics provided by oscilloscopes such as mean, standard deviation, min and max, do not cover. For 2D histograms, the entropy values form a set of entropy values, or an entropy vector set, along the horizontal axis or along the vertical axis.

For a 1-D histogram, the Entropy value can be calculated as $$H = -\Sigma_{k=1}^{n} p(k) \log(p(k)) \text{ for } p(k) > 0 \ k = 1, 2, \ldots, n \quad (1)$$

where:

p(k) is the normalized number of hits on the k-th bin representing probability:

$$p(k) = \text{hits}(k)/\text{total hits}$$

n is the number of bins.

For an ideal NRZ signal having a random bit sequence, the histogram across the center of the unit interval will only have two bins with same amount of hits. The two bins represent bit 1 and bit 0. The entropy equals 1 from the equation (1). For an ideal PAM4 signal, there are four bins representing symbol 0, 1, 2, 3. The entropy equals 2. When there are impairments in the signal, for example, inter-symbol-interference (ISI), the entropy value increases.

Figure 3:
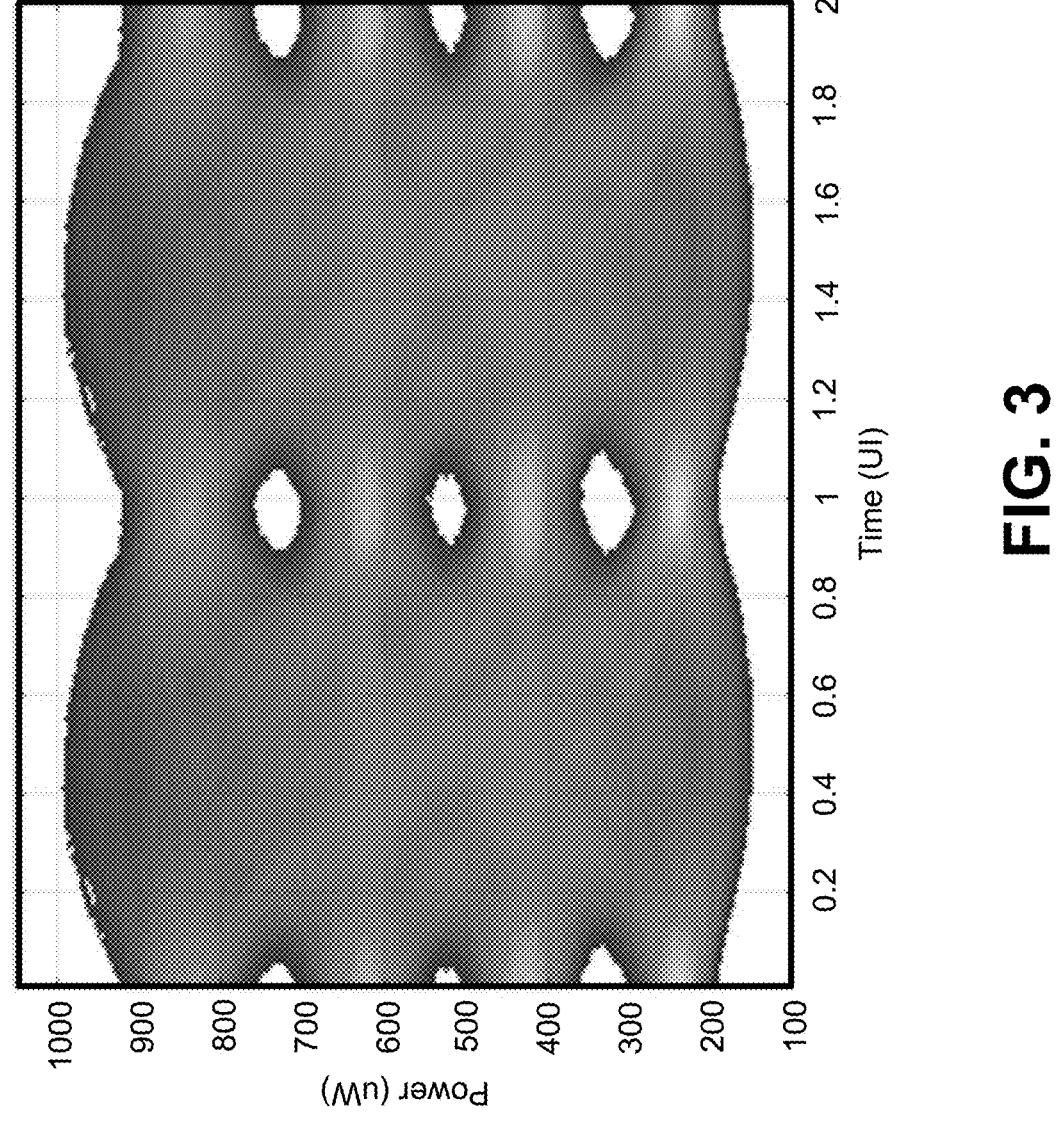
FIG. 3 shows an example of an eye diagram of a Pulse Amplitude Modulation-4 (PAM4) signal.

The eye diagram, used commonly in many different analyses of waveforms, generated by a test and measurement instrument comprises a two-dimensional histogram, with horizontal and vertical bins creating the two-dimensional grids as shown in FIG. 3. For purposes of this embodiment, the generating of the histogram comprises the generation of the eye diagram, as the eye diagram is itself a 2D histogram of multiple waveforms. For example, each location on the horizontal axis of an eye diagram has multiple values, or hits, in the vertical location, forming a column. Using only the individual rows or columns of the eye diagram creates a one-dimensional histogram. One can calculate the entropy value from the histogram. A horizontal entropy vector set results from calculating every column in the eye diagram. The test and measurement instrument can use that set of values to display horizontal entropy plot as shown in FIG. 4.

Figure 4:
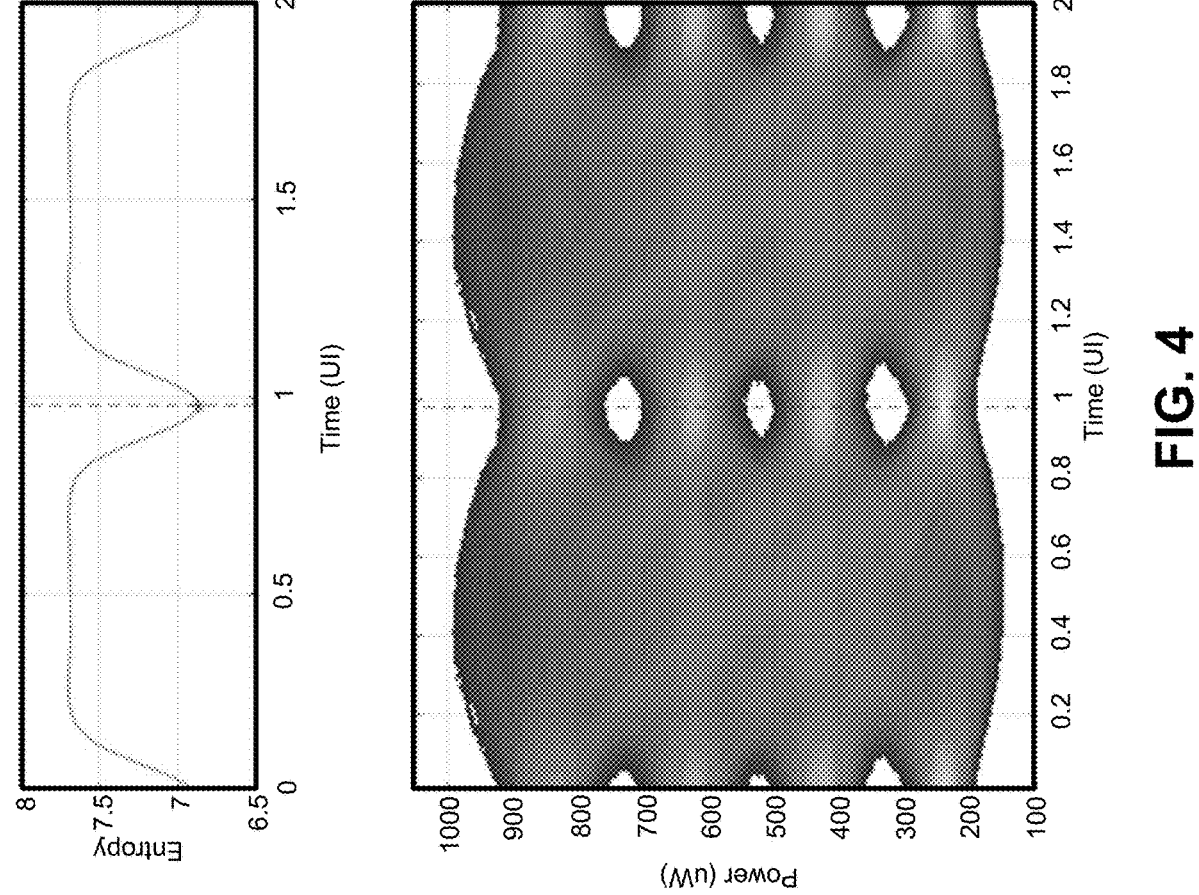
FIG. 4 shows a horizontal entropy plot derived from a PAM4 signal eye diagram.

From FIG. 4, one can see that the smallest entropy value the horizontal location corresponds to where the eye opens the most vertically. By looking for where the entropy value reaches its minimum value, one can find the horizontal location where the eye opens the most vertically. It works for PAMn where n can be 2, 3, 4, and other values, the entropy calculation is the same. FIG. 4 shows where entropy reaches its minimum, and the optimal horizontal location for vertical eye opening along the dashed line. Oscilloscopes and other test and measurement instruments typically perform horizontal auto set to find the location where the eye opens the most. To handle the situation where there are multiple local minimums, a low pass filter can be applied to the entropy vector to smooth out the curve and yield a global minimum that corresponds to the location where the eye opens the most vertically. For example, a boxcar filter with the width between 0.2 UI to 0.4 UI.

Similarly, using individual row of the eye diagrams results in a second one-dimensional histogram. One can calculate the entropy value from the histogram. In this case, one calculates the vertical entropy values in the entropy vector set from calculating every row in the eye diagram. The test and measurement instrument can then plot the values as an entropy plot as shown in FIG. 5.

Figure 5:
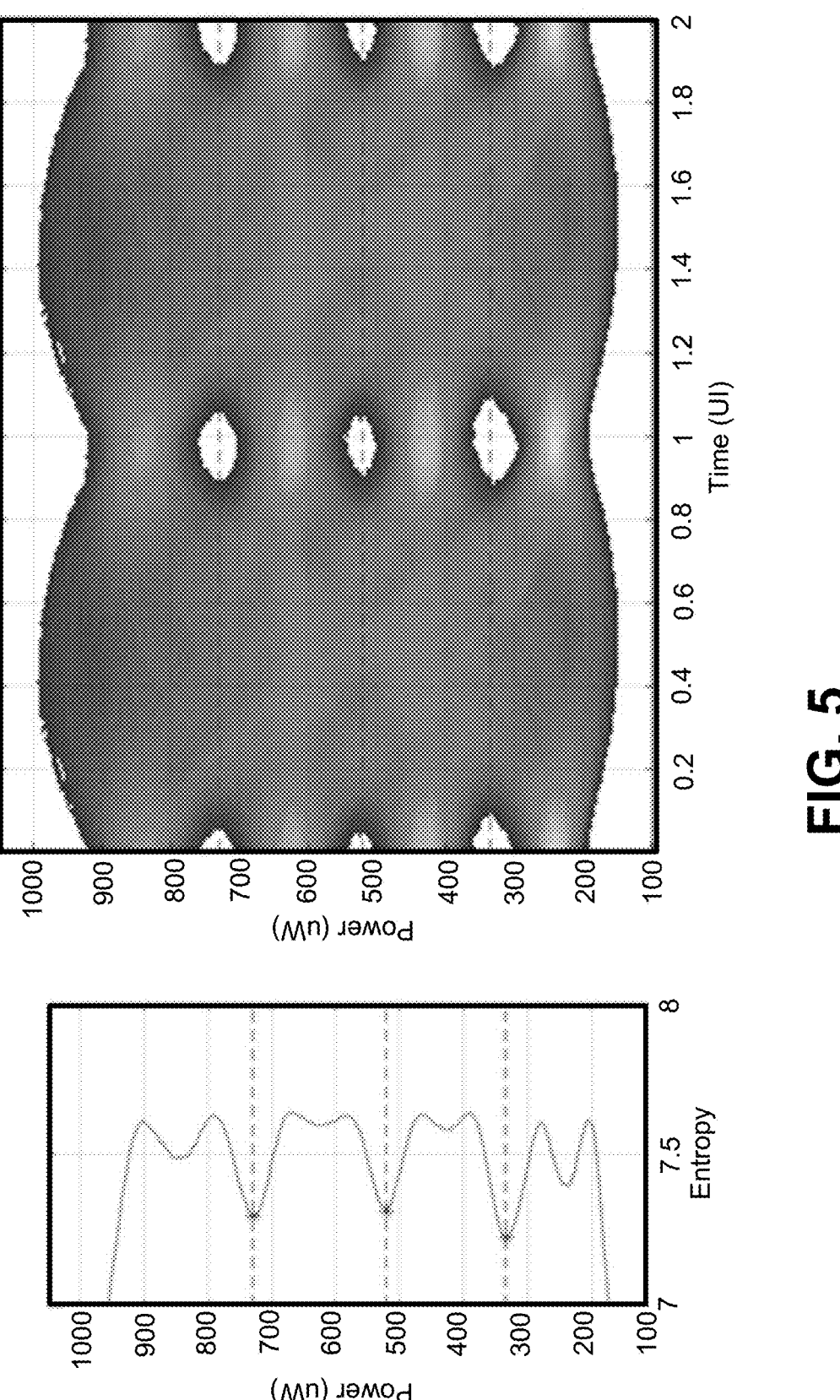
FIG. 5 shows a vertical entropy plot derived from a PAM4 signal eye diagram.

One can see in FIG. 5, that the smallest entropy values occur at three vertical levels where the eye opens the widest horizontally. By looking for where the entropy value reaches its local minimums as a set of low entropy values, or a minimum value, it can be used to find the vertical levels where the eye opens the most horizontally. The dashed line in FIG. 5 shows the optimal vertical levels for eye opening. As mentioned above, test and measurement instruments need to perform this determination for measurements analysis and auto set. To handle the situation where there are multiple local minimums for each eye diagrams, a low pass filter can be applied to the entropy vector to smooth out the curve and yield unique global minimum that corresponds to the location where the eye opens the most horizontal for that eye. For example, a boxcar filter with the width between 0.1 to 0.2 of the signal amplitude divided by the n−1 where n is number of levels in PAMn Signal.

Figure 6:
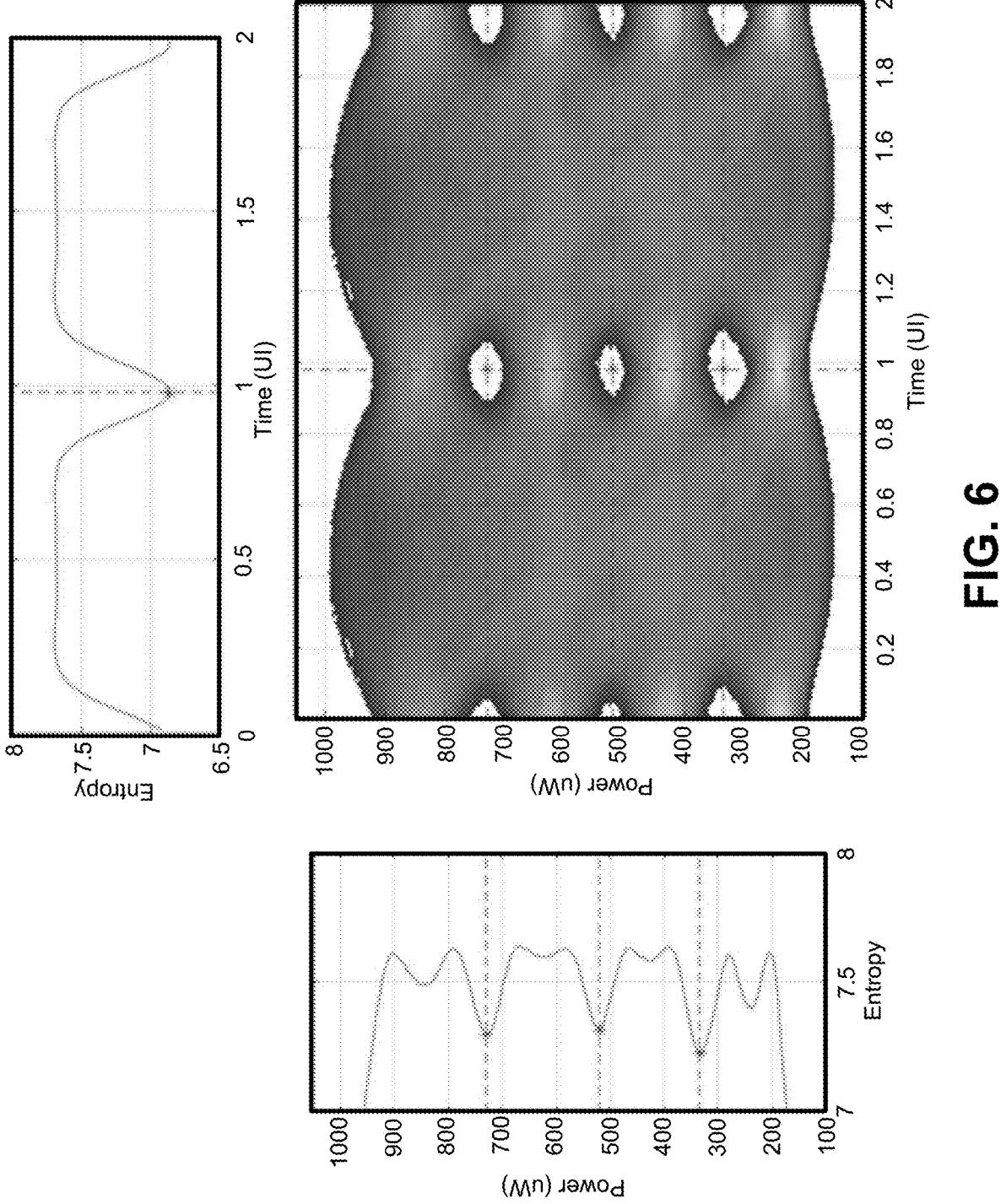
FIG. 6 shows a combination of horizontal and vertical entropy plots derived from a PAM4 signal eye diagram.

FIG. 6 shows a compilation of the eye diagram with the horizontal and vertical entropy plots. From the horizontal and vertical entropy plots shown above, the intersections of the horizontal offset line and the vertical level lines point to the three eye centers as shown with the dashed line.

The above discussion has shown that either the horizontal entropy data or the vertical entropy data can be used for horizontal or vertical auto set for display, and for measurements and analysis.

The horizontal entropy plot of FIG. 4 shows that the entropy vector value increases when the eye diagram becomes more closed vertically. This makes the entropy a good candidate for a figure of merit (FOM). The entropy value can be calculated quickly using equation (1). The horizontal entropy calculation does not need to know whether the underline signal is NRZ, PAM4 or other PAMn. It is much simpler to calculate than some other FOM such as SNDR and TDECQ, make it more efficient to solve certain optimization problems such as CTLE/DFE optimization required by industrial standards such as Ethernet and PCIE.

The entropy values are used to perform auto set for display, measurement, and analysis. The entropy can also be used as a figure of merit (FOM). Entropy involves simple calculation so it can be obtained efficiently.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

EXAMPLES

Illustrative examples of the disclosed technologies are provided below. An embodiment of the technologies may include one or more, and any combination of, the examples described below.

Example 1 is a test and measurement device, comprising: a port to receive a signal from a device under test (DUT); one or more analog-to-digital converters (ADC) to digitize the signal to create one or more waveforms; a display; and one or more processors configured to execute code that causes the one or more processors to: generate a histogram from the one or more waveforms, the histogram having one or more dimensions; and calculate one or more entropy values for each of the one or more dimensions.

Example 2 is the test and measurement device of Example 1, wherein the code that causes the one or more processors to generate a histogram causes the one or more processors to generate a one-dimensional histogram and calculate one entropy value from the one-dimensional histogram.

Example 3 is the test and measurement device of either Examples 1 or 2, wherein the code that causes the one or more processors to generate a histogram causes the one or more processors to generate a two-dimensional histogram.

Example 4 is the test and measurement device of Example 3, wherein the code that causes the one or more processors to calculate one or more entropy values for each of the one or more dimensions causes the one or more processors to calculate a value for each column of the two-dimensional histogram to produce a horizontal entropy vector set.

Example 5 is the test and measurement device of Example 4, wherein the one or more processors are further configured to apply a low pass filter, and determine one or more low entropy values and a minimum value of the horizontal entropy vector set.

Example 6 is the test and measurement device of Example 3, wherein the code that causes the one or more processors to calculate one or more entropy values for each of the one or more dimensions causes the one or more processors to calculate a value for each row of a two-dimensional histogram to produce a vertical entropy vector set.

Example 7 is the test and measurement device of Example 6, wherein the one or more processors are further configured to apply a low pass filter and determine at least one or more low entropy values and a minimum value of the vertical entropy vector set.

Example 8 is the test and measurement device of Example 3, wherein the one or more processors are further configured to execute code that causes the one or more processors to use the entropy vector set for one of auto set for display of the eye diagram to locate the center of an eye diagram, or as a measurement of the waveform.

Example 9 is the test and measurement device of Example 1, wherein the one or more processors are further configured to execute code that causes the one or more processors to use the one or more entropy values as a figure of merit for the waveform.

Example 10 is the test and measurement device of any of Examples 1 through 9, wherein the one or more processors are further configured to execute code that causes the one or more processors to display the set of entropy values as an entropy plot.

Example 11 is a method, comprising: receiving a signal from a device under test (DUT) at a test and measurement device; digitizing the signal using one or more analog-to-digital converters (ADC) to produce a waveform; generating a histogram from the waveform, the histogram having one or more dimensions; and calculating one or more entropy values for each of the one or more dimensions.

Example 12 is the method of Example 11, wherein generating a histogram comprises generating one-dimensional histogram and calculating one entropy value comprises calculating one entropy value for the one-dimensional histogram.

Example 13 is the method of either of Examples 11 or 12, generating a histogram comprises generating a two-dimensional histogram.

Example 14 is the method of any of Examples 11 through 13, wherein calculating one or more entropy values for each of the one or more dimensions comprises calculating an entropy value for each column of a two-dimensional histogram to produce a horizontal entropy vector set.

Example 15 is the method of any of Examples 11 through 14, wherein determining one or more entropy values comprises applying a low pass filter and determining at least one of a minimum value of the horizontal entropy vector set, and a set of low entropy values of the horizontal entropy vector set.

Example 16 is the method of any of Examples 11 through 15, wherein calculating a value for each of the one or more dimensions to produce a set of entropy values comprises calculating a value for each row of a two-dimensional histogram to produce a vertical entropy vector set.

Example 17 is the method of Example 16, wherein determining one or more low entropy values comprises applying a low pass filter and determining at least one of a set of low entropy values of the vertical entropy vector set, and a minimum entropy value of the vertical entropy vector set.

Example 18 is the method of any of Examples 11 through 17, wherein using the one or more entropy values comprises using the one or more low entropy values for one of auto set for display of the eye diagram by locating the center of an eye diagram vertically and horizontally based upon the entropy vector set, or as a measurement of the waveform.

Example 19 is the method of any of Examples 11 through 18, wherein using the one or more entropy values comprises using the one or more entropy values as a figure of merit for the waveform.

Example 20 is the method of any of Examples 11 through 19, further comprising displaying the one or more entropy values as an entropy plot on a display of the test and measurement device.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although specific embodiments have been illustrated and described for purposes of illustration, it will be understood that various modifications may be made without departing from the spirit and scope of the disclosure. Accordingly, the invention should not be limited except as by the appended claims.

I claim:

1. A test and measurement device, comprising:
a port to receive a signal from a device under test (DUT);
one or more analog-to-digital converters (ADC) to digitize the signal to create one or more waveforms;
a display; and one or more processors configured to execute code that causes the one or more processors to:
perform a test on the DUT;
receive the signal from the DUT in response to performing a test on the DUT;
generate an eye diagram and use the eye-diagram as a two-dimensional histogram from the one or more waveforms, the two-dimensional histogram having a one-dimensional histogram in a horizontal dimension and a one-dimensional histogram in a vertical dimension, the histogram having a number of bins, n, and a normalized number of hits, p(k), on each k-th bin;
calculate one or more entropy values from the histogram for each of the dimensions using the formula $$H = -\Sigma_{k=1}{}^n p(k)\log(p(k)) \text{ for } p(k) > 0 \ k = 1, 2, \ldots, n;$$

use the one or more entropy values to locate the center of the eye diagram using a global minimum from the entropy values for each of the dimensions and auto setting the eye diagram using the center of the eye diagram;
display the one or more entropy values for each dimension as an entropy plot with the eye diagram; and
use the one or more entropy values as a figure of merit (FOM) to determine if performance of the DUT meets a standard.

2. The test and measurement device as claimed in claim 1, wherein the code that causes the one or more processors to calculate one or more entropy values for each of the dimensions causes the one or more processors to calculate a value for each column of the two-dimensional histogram to produce a horizontal entropy vector set.

3. The test and measurement device as claimed in claim 2, wherein the one or more processors are further configured to apply a low pass filter, and determine one or more low entropy values and a minimum value of the horizontal entropy vector set.

4. The test and measurement device as claimed in claim 1, wherein the code that causes the one or more processors to calculate one or more entropy values for each of the dimensions causes the one or more processors to calculate a value for each row of the two-dimensional histogram to produce a vertical entropy vector set.

5. The test and measurement device as claimed in claim 4, wherein the one or more processors are further configured to apply a low pass filter and determine at least one or more low entropy values and a minimum value of the vertical entropy vector set.

6. The test and measurement device as claimed in claim 1, wherein the one or more processors are further configured to execute code that causes the one or more processors to use the one or more entropy values as a figure of merit for the waveform.

7. A method, comprising:
performing a test on a device under test (DUT);
receiving a signal from the (DUT) at a test and measurement device;
digitizing the signal using one or more analog-to-digital converters (ADC) to produce one or more waveforms;
generating an eye diagram and using the eye diagram as a two-dimensional histogram from the one or more waveforms, the two-dimensional histogram having a one-dimensional histogram in a horizontal dimension and a one-dimensional histogram in a vertical dimension, and a number of bins, n;

calculating one or more entropy values for each of the two dimensions according to a formula $$H = -\Sigma_{k=1}{}^{n} p(k)\log(p(k)) \text{ for } p(k) > 0 \ k=1,2, \ldots ,n,$$
where $p(k)$ is a normalized number of hits on the $k$-$th$ bin;

using the one or more entropy values to locate the center of the eye diagram using a global minimum from the entropy values for each of the dimensions and auto setting the eye diagram using the center of the eye diagram;

displaying the one or more entropy values for each dimension as an entropy plot with the eye diagram; and use the one or more entropy values as a figure of merit to determine if performance of the DUT meets a standard.

8. The method as claimed in claim 7, wherein calculating one or more entropy values for each of the dimensions comprises calculating an entropy value for each column of the two-dimensional histogram to produce a horizontal entropy vector set.

9. The method as claimed in claim 8, wherein determining one or more entropy values comprises applying a low pass filter and determining at least one of a minimum value of the horizontal entropy vector set, and a set of low entropy values of the horizontal entropy vector set.

10. The method as claimed in claim 7, wherein calculating a value for each of the dimensions to produce a set of entropy values comprises calculating a value for each row of the two-dimensional histogram to produce a vertical entropy vector set.

11. The method as claimed in claim 10, wherein determining one or more low entropy values comprises applying a low pass filter and determining at least one of a set of low entropy values of the vertical entropy vector set, and a minimum entropy value of the vertical entropy vector set.

12. The method as claimed in claim 7, further comprising using the one or more entropy values as a figure of merit for the waveform.

\* \* \* \* \*